United States Patent
Kawabata

(10) Patent No.: US 6,714,438 B2
(45) Date of Patent: Mar. 30, 2004

(54) SEMICONDUCTOR DEVICE WITH HIGH SPEED LATCH OPERATION

(75) Inventor: Kuninori Kawabata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/100,044

(22) Filed: Mar. 19, 2002

(65) Prior Publication Data

US 2003/0063489 A1 Apr. 3, 2003

(30) Foreign Application Priority Data

Oct. 3, 2001 (JP) ........................................ 2001-307901

(51) Int. Cl.[7] .............................. G11C 11/00; G11C 8/00
(52) U.S. Cl. .............. 365/154; 365/230.06; 365/230.08
(58) Field of Search ................................. 365/233, 154, 365/194, 230.06, 189.05, 204, 214, 230.08

(56) References Cited

U.S. PATENT DOCUMENTS

| | | | |
|---|---|---|---|
| 5,517,136 A | * 5/1996 | Harris et al. | ................... 326/93 |
| 5,675,615 A | * 10/1997 | Watt | ........................... 375/354 |
| 6,026,036 A | 2/2000 | Sekiya et al. | ................ 365/200 |
| 6,172,537 B1 | * 1/2001 | Kanou et al. | .................. 327/99 |

* cited by examiner

Primary Examiner—Thong Q. Le
(74) Attorney, Agent, or Firm—Arent Fox Kintner Plotkin & Kahn

(57) ABSTRACT

A semiconductor device includes a first latch which receives an input signal, and holds the input signal during a half cycle period of a first clock signal, a delay element coupled to an output of the first latch, a second latch which is coupled to an output of the delay element, and holds a signal output from the delay element during a half cycle period of a second clock signal, and a circuit which adjusts at least one of the first clock signal and the second clock signal such that the signal latched by the first latch during the half cycle period of the first clock signal is latched via the delay element by the second latch during the half cycle period of the second clock signal that follows the half cycle period of the first clock signal.

9 Claims, 17 Drawing Sheets

SEMICONDUCTOR DEVICE WITH HIGH SPEED LATCH OPERATION

BACKGROUND OF THE INVENTION

1. Field of the Invention

The present invention generally relates to semiconductor devices, and particularly relates to a semiconductor device provided with an input latch that captures a signal in synchronization with a clock signal.

2. Description of the Related Art

As the operation speed of CPUs increases, semiconductor devices such as semiconductor memory devices associated with the CPUs need to have an increased operation speed.

In synchronous (clock-synchronized) memories, command inputs (or address inputs) are entered such as to satisfy a setup time and a hold time relative to a rising edge of an external clock signal. The input commands latched by latch circuits (edge-triggered latches) provided at the first stage are held for 1tCK (tCK: one clock cycle), and are decoded by a decoder during this data hold time.

FIG. 1 is a drawing showing a related-art configuration of input circuits and decoders. FIG. 2 is a timing chart showing an operation of the configuration of FIG. 1.

The configuration of FIG. 1 includes a latch 10, a latch 11, and a decoder 12. The latch 10 includes a gated inverter 13, an inverter 14, and a gated inverter 15. The latch 11 includes a gated inverter 16, an inverter 17, and a gated inverter 18. One set of the latch 10 and latch 11 is provided for each of incoming signals in0 and in1.

The latch 10 receives a complementary signal intCLK_c that is complementary to a clock signal intCLK_t, and the latch 11 receives the clock signal intCLK_t. When the clock signal intCLK_t is LOW (when the complementary signal intCLK_c is HIGH), the gated inverter 13 of the latch 10 inverts the incoming signal in0 (or in1), and supplies the inverted signal to a latch circuit 20 that is formed by the inverter 14 and the gated inverter 15. When clock signal intCLK_t changes to HIGH, the latch circuit 20 latches the incoming signal. At this time, the gated inverter 16 of the latch 11 is open, so that the signal that is latched by the latch circuit 20 is output through the latch 11 as latched signals in0lat and in1lat. When the clock signal intCLK_t thereafter turns to LOW, the gated inverter 16 closes, and the incoming signal is latched by a latch circuit 21 that is formed by the inverter 17 and the gated inverter 18. Even when a next incoming signal arrives at the latch 10 during the period in which the clock signal intCLK_t is LOW, the preceding incoming signal latched by the latch circuit 21 will be held there until the clock signal intCLK_t is set to HIGH.

In this manner, as shown in FIG. 2, the latched signals in0lat and in1lat obtained by latching the incoming signals are held for the duration of the period 1tCK (tCK: one clock period). Within this period, the decoder 12 of FIG. 1 decodes the latched signal in0lat and in1lat, and outputs output signals out<0:3> as results of the decoding.

In order to determine the incoming signals before the latch 10 latches the incoming signals, the setup time needs to be secured as shown in FIG. 2. In the configuration described above, the decoding time for the decoder 12 to decode the incoming signals is necessary in addition to the setup time. Accordingly, a delay equivalent to the sum of the setup time and the decoding time is incurred before the decoding results are obtained from the incoming data signals.

In order to obviate this problem, a scheme has been devised to utilize the setup time to complete the decoding operation before the latch operation.

FIG. 3 is a drawing showing a related-art configuration of command (or address) input circuits and a decoder which achieves speed enhancement by utilizing the setup time. FIG. 4 is a timing chart showing an operation of the configuration of FIG. 3. As shown in FIG. 3 and FIG. 4, the decoder 12 in this configuration is situated at a stage preceding the latches 10 and 11, and carries out its decoding operation within the setup time of the latches, thereby achieving the speed enhancement.

In this configuration, however, a large number of latches are necessary since a large number of decoded signals need to be latched separately. When 2-bit inputs are to be decoded as shown in FIG. 3, for example, 8 latches in total are necessary. When 3-bit inputs are to be decoded, 16 latches in total are necessary.

In this configuration, further, a timing adjustment circuit 22 is used to delay a clock signal, thereby setting the latch timing to a proper timing that takes into account the decoding time of the decoder. Since the timing adjustment circuit 22 may suffer timing deviation due to a product variation, power supply potential fluctuation, etc., there is a need to secure a large timing margin.

The related-art configuration shown in FIG. 3, therefore, results in an increase of chip size, and may not be able to achieve a sufficient speed enhancement because of the need to secure a large timing margin that takes into account timing deviation caused by a product variation, power supply potential fluctuation, etc. Further, if a large timing margin is given to the setup time, the timing margin for the hold time will have to be decreased. In general, the setup time and the hold time shorten as the clock cycle shortens. In the systems having an increased clock speed, thus, it is difficult to secure a sufficient timing margin.

Accordingly, there is a need for a semiconductor device in which the speed of a first-stage input latch is increased without increasing chip size.

SUMMARY OF THE INVENTION

It is a general object of the present invention to provide a semiconductor device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor device particularly pointed out in the specification in such full, clear, concise, and exact terms as to enable a person having ordinary skill in the art to practice the invention.

To achieve these and other advantages and in accordance with the purpose of the invention, as embodied and broadly described herein, a semiconductor device according to the present invention includes a first latch which receives an input signal, and holds the input signal during a half cycle period of a first clock signal, a delay element coupled to an output of the first latch, a second latch which is coupled to an output of the delay element, and holds a signal output from the delay element during a half cycle period of a second clock signal, and a circuit which adjusts at least one of the first clock signal and the second clock signal such that the signal latched by the first latch during the half cycle period of the first clock signal is latched via the delay element by the second latch during the half cycle period of the second clock signal that follows the half cycle period of the first clock signal.

In the semiconductor device as described above, the delay element may be a decoder, for example. In this example of the present invention, the decoder is situated between the two latches together forming an edge-trigger circuit, and carries out the decoding operation by utilizing the setup time, thereby hiding a time delay caused by the decoding operation. In this configuration, it suffices to have the first-stage latches only as many as there are incoming signals, so that a high-speed latch-&-decode operation can be achieved through a smaller number of circuit elements than in the related-art configuration. Further, the timing adjustment of clock signals makes it possible to achieve reliable data transfer from the first latch to the second latch.

According to another aspect of the present invention, a semiconductor device includes a first latch which receives an input signal, and holds the input signal during a half cycle period of a first clock signal, a long-distance wire having one end thereof coupled to an output of the first latch, and a second latch which is coupled to another end of the long-distance wire, and holds the input signal supplied from the long-distance wire during a half cycle period of a second clock signal.

In the semiconductor device as described above, the long-distance wire is situated between the two latches together forming an edge-trigger circuit, and transfers signals by utilizing the setup time, thereby hiding a time delay caused by the signal transfer. This achieves high-speed data transfer.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
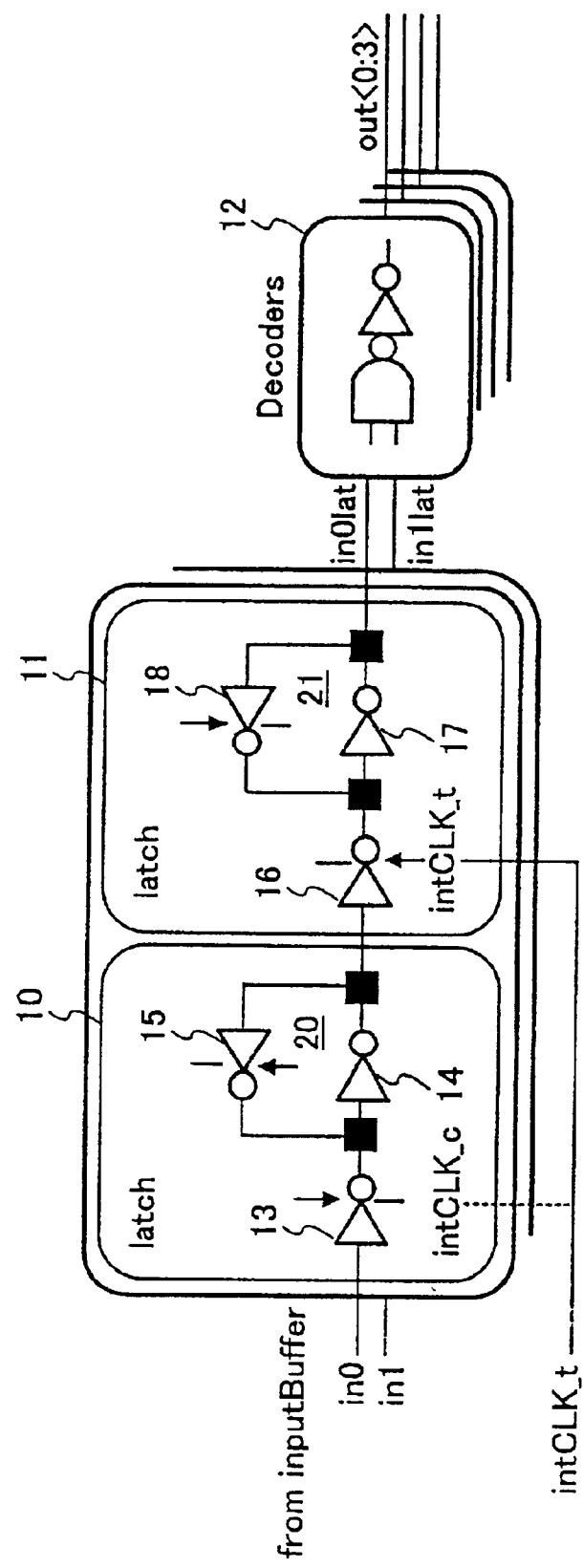
FIG. 1 is a drawing showing a related-art configuration of input circuits and decoders.
Figure 2:
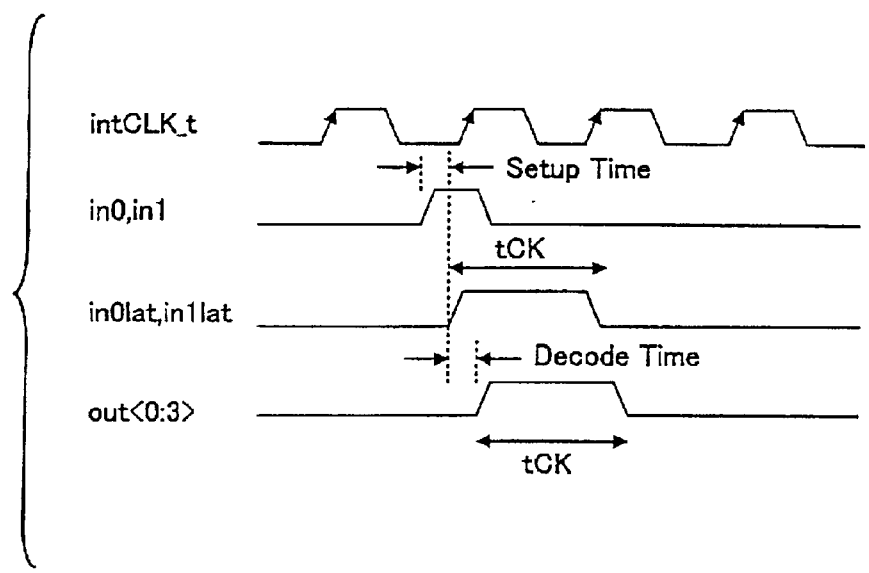
FIG. 2 is a timing chart showing an operation of the configuration of FIG. 1.
Figure 5:
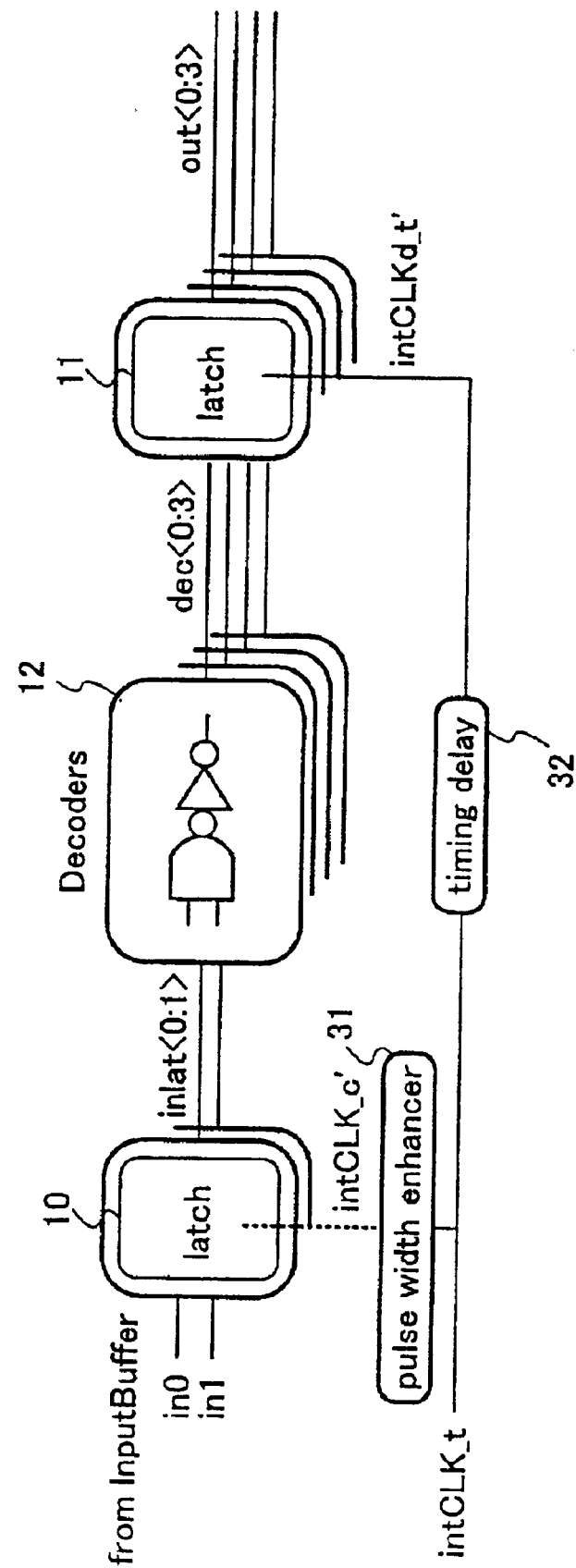
FIG. 5 is a block diagram showing a first embodiment of a latch circuit according to the present invention.

FIG. 5 is a block diagram showing a first embodiment of a latch circuit according to the present invention. An edge-trigger circuit is comprised of two latches, i.e., a latch of the first stage that holds a signal during the HIGH period of a clock signal while the signal is transferred during the LOW period of the clock signal, and a latch of the second stage that holds the signal during the LOW period of the clock signal while the signal is transferred during the HIGH period of the clock signal. In the first embodiment, these two latched are separated, and a decoder is provided therebetween. In FIG. 5, the same elements as those of FIG. 1 are referred to by the same numerals, and a description thereof will be omitted.

The configuration of FIG. 5 includes the latch 10, the latch 11, the decoder 12, and a pulse width enhancer 31. The decoder 12 is situated between the latch 10 and the latch 11. The latch 10 receives a clock signal intCLK_c' that is complementary to a signal obtained by extending the pulse width of a clock signal intCLK_t by use of the pulse width enhancer 31. The latch 11 receives a clock signal intCLKd_t' obtained by delaying the clock signal intCLK_t through the timing delay 32. Here, the timing delay 32 is a wire delay inherently associated with the long wires between the latch 10 and the latch 11 when the distance between the latch 10 and the latch 11 is increased by the provision of the decoder 12. When there is a need to take into consideration the decoding time of the decoder 12, a delay circuit or the like may be inserted on purpose. It should be noted that incoming signals in0 and in1 may be command signals, address signals, or the like that are supplied to a semiconductor device such as a semiconductor memory device or the like.

Figure 6:
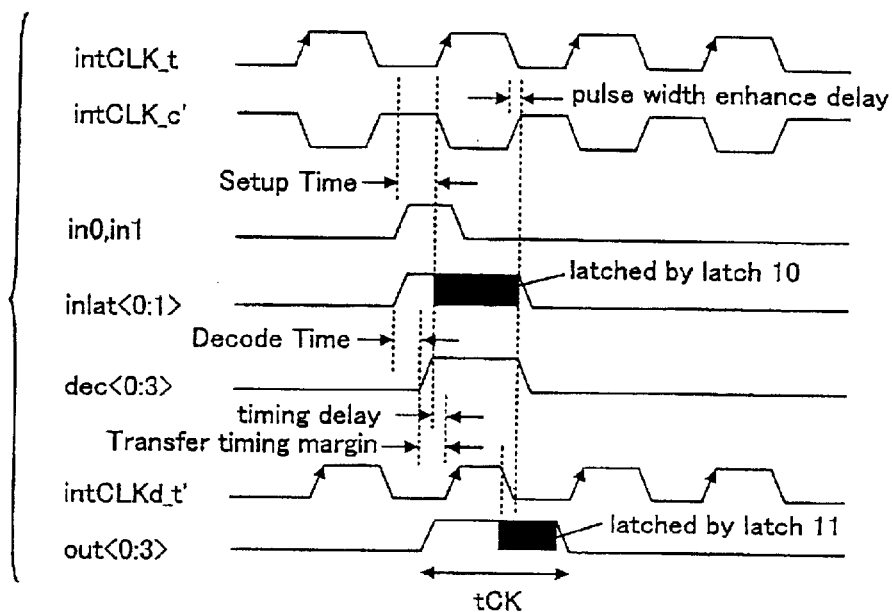
FIG. 6 is a timing chart showing an operation of the configuration of FIG. 5.

FIG. 6 is a timing chart showing an operation of the configuration of FIG. 5.

As shown in FIG. 6, when the incoming signals in0 and in1 are input by securing the setup time relative to a falling edge of the complementary clock signal intCLK_c', these incoming signals will pass through the latch 10 to be supplied to the decoder 12. The decoder 12 performs decoding by utilizing the setup time. At the timing of a rising edge of the clock signal intCLK_t, the latch 10 latches the incoming signals in0 and in1. The signals inlat<0:1> latched by the latch 10 are converted into decode signals dec<0:3> by the decoder 12, which then pass through the latch 11 that has come out from the latched state thereof, thereby being supplied to the following stage as output signals out<0:3>. At the timing of a falling edge of the delay clock signal intCLKd_t', the decode signals dec<0:3> are latched by the latch 11. The signals that are latched by the latch 11 are supplied to the following stage as the output signals out<0:3>, and will be held while the delay clock signal intCLKd_t' is LOW. In this manner, the output signals out<0:3>are output during a period of 1tCK (tCK: one clock cycle).

Since the clock signal intCLKd_t' is delayed by the timing delay 32 such as a wire delay, the period during which the latch 10 holds the latched signals needs to be lengthened in order to achieve proper transfer of the signals latched by the latch 10 to the latch 11 through the decoder 12. If the latch signal hold time of the latch 10 remains the same as the HIGH period of the original clock signal intCLK_t, the contents of the latch 10 will be rewritten by the next signals when the latch 11 latches the data at the falling edge of the delay clock signal intCLKd_t'. This results in a failure to conduct proper signal transfer.

In the configuration of FIG. 5, therefore, the pulse width enhancer 31 extends the latch signal hold time of the latch 10, thereby achieving proper signal transfer as shown in FIG. 6.

Figure 3:
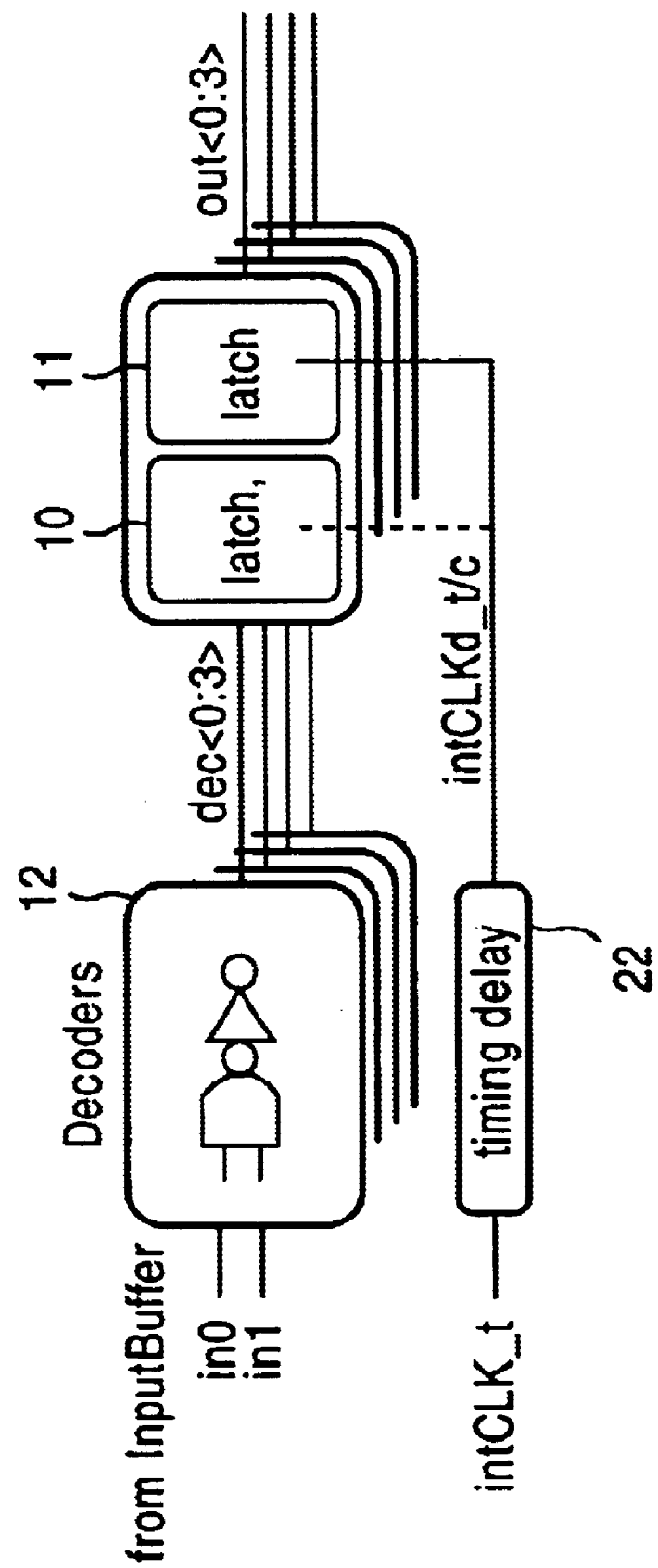
FIG. 3 is a drawing showing a related-art configuration of command (or address) input circuits and a decoder which achieves speed enhancement by utilizing a setup time.
Figure 4:
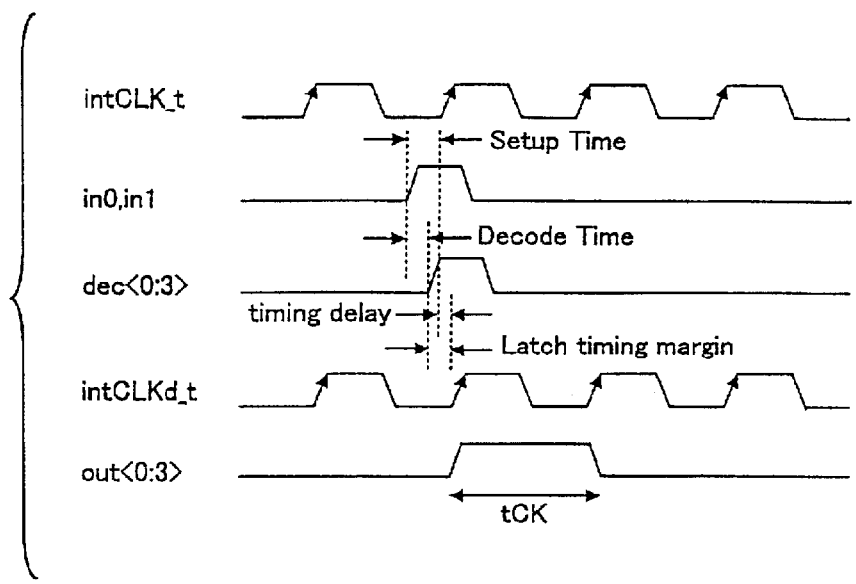
FIG. 4 is a timing chart showing an operation of the configuration of FIG. 3.

In the present invention as described above, the decoder is situated between the two latches together forming an edge-trigger circuit, and carries out the decoding operation by utilizing the setup time, thereby hiding a time delay caused by the decoding operation. In this configuration, it suffices to have the first-stage latches only as many as there are incoming signals, so that a high-speed latch-&-decode operation can be achieved through a smaller number of circuit elements than the related-art configuration of FIG. 3. Since the pulse width enhancer extends the pulse width and does nothing more, the latch timing of the first-stage latch is basically an edge timing for which no timing adjustment is made. This configuration generates less timing deviation than the related-art configuration that uses the timing adjustment circuit. It should be noted that the timing width enhancer does not have to be provided if the timing margin is sufficient.

Figure 7:
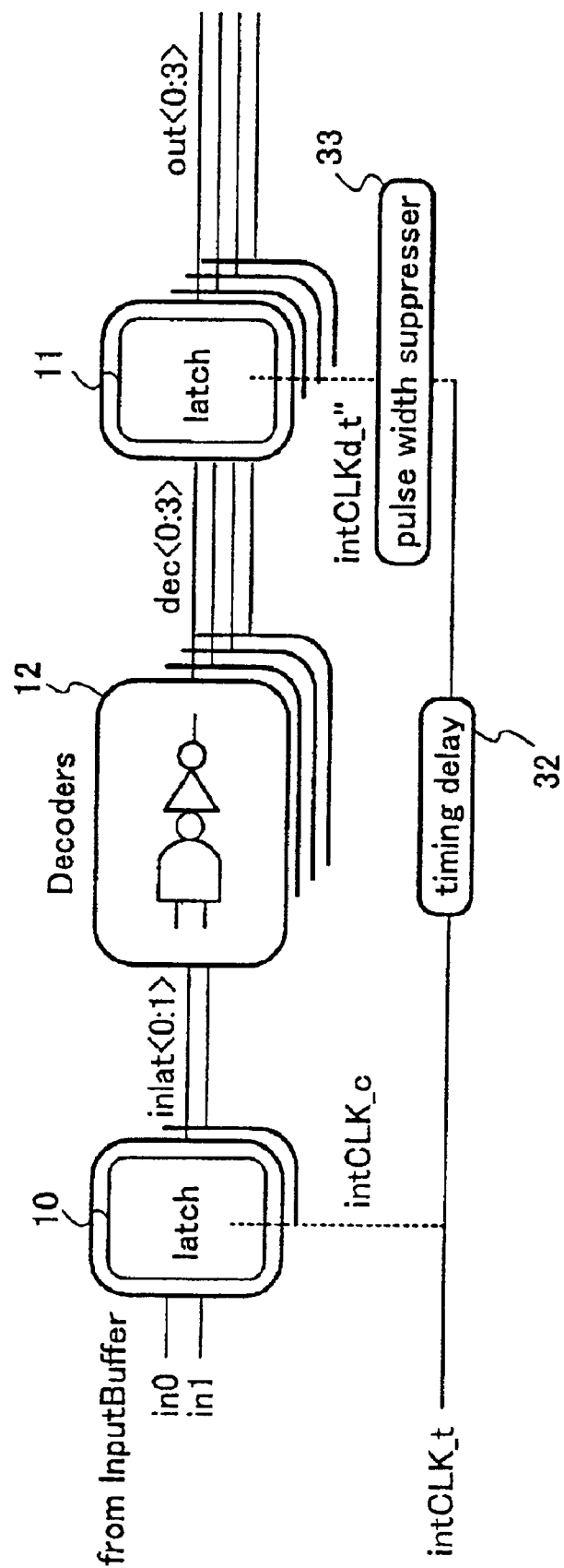
FIG. 7 is a block diagram showing a second embodiment of the latch circuit according to the present invention.

FIG. 7 is a block diagram showing a second embodiment of the latch circuit according to the present invention. In the second embodiment, a pulse width suppresser 33 is provided instead of the pulse width enhancer 31 of FIG. 5. In FIG. 7, the same elements as those of FIG. 5 are referred to by the same numerals.

The configuration of FIG. 7 includes the latch 10, the latch 11, the decoder 12, and the timing delay 32. The decoder 12 is situated between the latch 10 and the latch 11. The latch 10 receives a clock signal intCLK_c that is complementary to the clock signal intCLK_t. The latch 11 receives a clock signal intCLKd_t" that is obtained by shortening the pulse width by the pulse width suppresser 33 of the clock signal delayed by the timing delay 32. It should be noted that incoming signals in0 and in1 may be command signals, address signals, or the like that are supplied to a semiconductor device such as a semiconductor memory device or the like.

Figure 8:
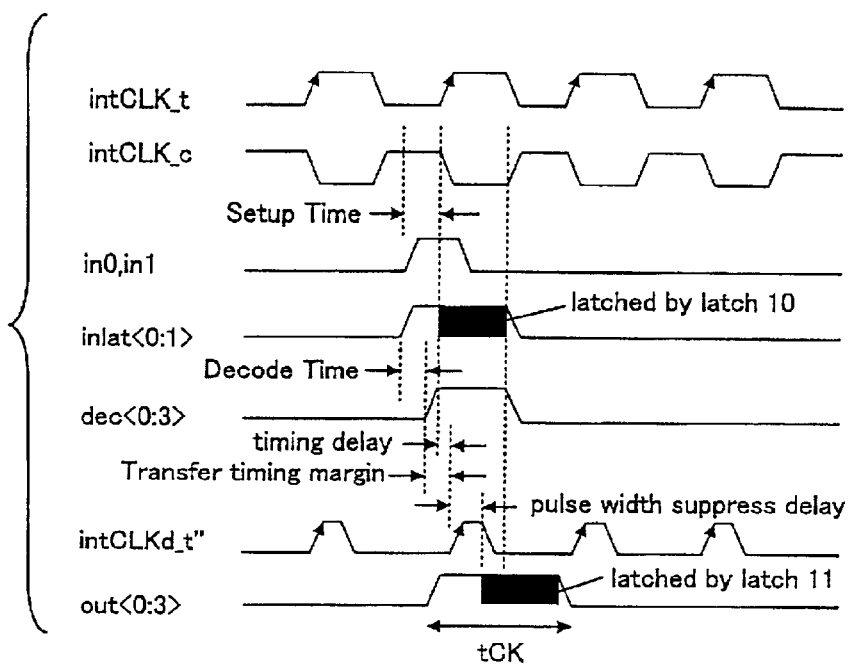
FIG. 8 is a timing chart showing an operation of the configuration of FIG. 7.

FIG. 8 is a timing chart showing an operation of the configuration of FIG. 7.

As shown in FIG. 8, when the incoming signals in0 and in1 are input by securing the setup time relative to a falling edge of the complementary clock signal intCLK_c, these incoming signals will pass through the latch 10 to be supplied to the decoder 12. The decoder 12 performs decoding by utilizing the setup time. At the timing of a rising edge of the clock signal intCLK_t, the latch 10 latches the incoming signals in0 and in1. The signals inlat<0:1> latched by the latch 10 are converted into decode signals dec<0:3> by the decoder 12, which then pass through the latch 11 that has come out from the latched state thereof, thereby being supplied to the following stage as output signals out<0:3>. At the timing of a falling edge of the clock signal intCLKd_t", the decode signals dec<0:3> are latched by the latch 11. The signals that are latched by the latch 11 are supplied to the following stage as the output signals out<0:3>, and will be held while the clock signal intCLKd_t" having the pulse width thereof reduced by the pulse width suppresser 33 is LOW. In this manner, the output signals out<0:3> are output during a period of 1tCK (tCK: one clock cycle).

In the second embodiment, the effect achieved in the first embodiment by delaying the latch release timing of the latch 10 is achieved by advancing the latch setting timing of the latch 11. Namely, the pulse width suppresser 33 brings forward the latch timing of the latch 11, thereby achieving proper signal transfer as shown in FIG. 8.

In the present invention as described above, the decoder is situated between the two latches together forming an edge-trigger circuit, and carries out the decoding operation by utilizing the setup time, thereby hiding a time delay caused by the decoding operation. In this configuration, it suffices to have the first-stage latches only as many as there are incoming signals, so that a high-speed latch-&-decode operation can be achieved through a smaller number of circuit elements than the related-art configuration of FIG. 3. It should be noted that the timing width suppresser 33 does not have to be provided if the timing margin is sufficient.

Figure 9:
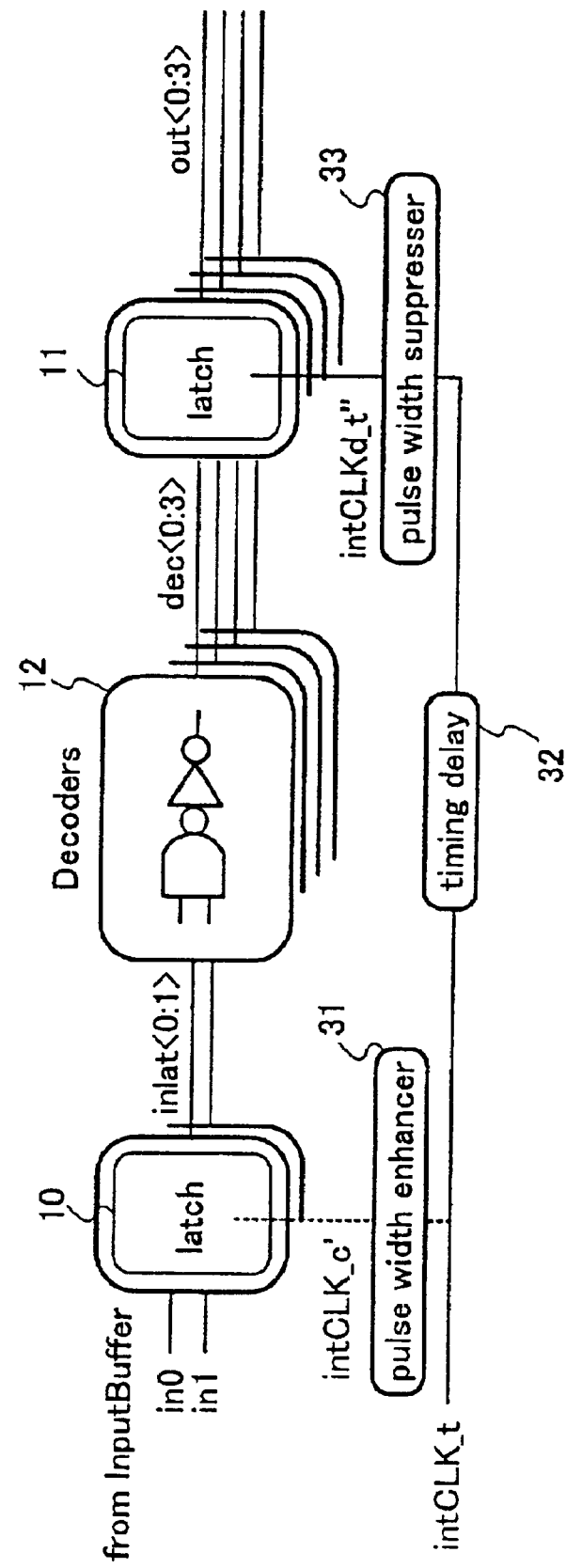
FIG. 9 is a block diagram showing a third embodiment of the latch circuit according to the present invention.

FIG. 9 is a block diagram showing a third embodiment of the latch circuit according to the present invention. In the third embodiment, the pulse width suppresser 33 is provided in addition to the configuration of FIG. 5. In FIG. 9, the same elements as those of FIG. 5 and FIG. 7 are referred to by the same numerals.

The configuration of FIG. 9 includes the latch 10, the latch 11, the decoder 12, and the timing delay 32. The decoder 12 is situated between the latch 10 and the latch 11. The latch 10 receives a clock signal intCLK_c' that is complementary to a signal obtained by extending the pulse width of the clock signal intCLK_t by use of the pulse width enhancer 31. The latch 11 receives a clock signal intCLKd_t" that is obtained by shortening the pulse width by the pulse width suppresser 33 of the clock signal delayed by the timing delay 32. It should be noted that incoming signals in0 and in1 may be command signals, address signals, or the like that are supplied to a semiconductor device such as a semiconductor memory device or the like.

Figure 10:
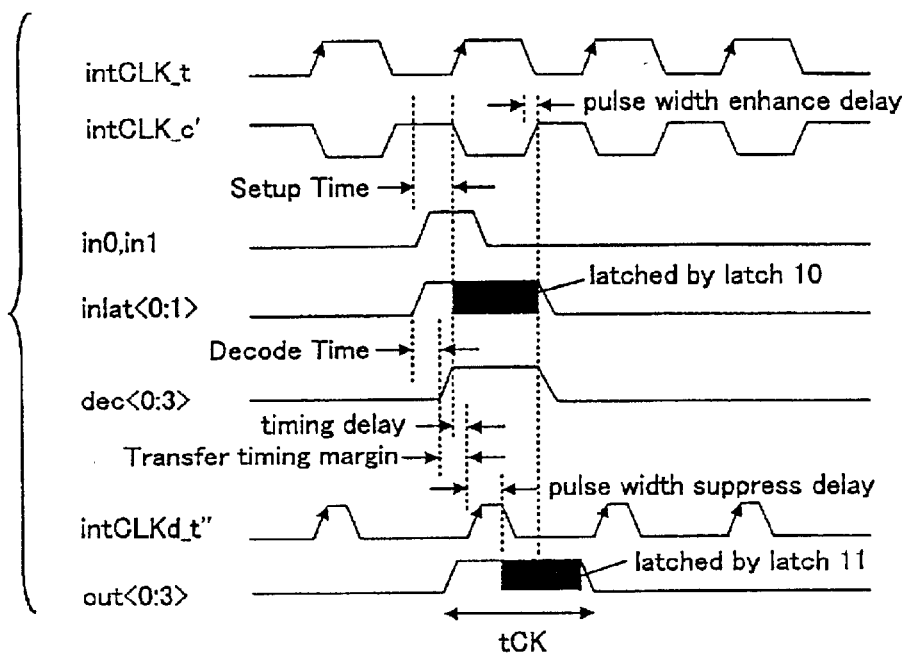
FIG. 10 is a timing chart showing an operation of the configuration of FIG. 9.

FIG. 10 is a timing chart showing an operation of the configuration of FIG. 9.

As shown in FIG. 10, the latched signals inlat<0:1> latched by the latch 10 are held during the LOW period of the complementary clock signal intCLK_c' that is extended by the pulse width enhancer 31. The decode signals dec<0:3> obtained from the latched signals inlat<0:1> are latched by the latch 11 at the timing of a falling edge of the clock signal intCLKd_t" that is brought forward by the pulse width suppresser 33.

In the third embodiment, the pulse width enhancer 31 delays the latch release timing of the latch 10, and, at the same time, the pulse width suppresser 33 advances the latch setting timing of the latch 11, thereby achieving proper signal transfer as shown in FIG. 10. Use of both the pulse width enhancer 31 and the pulse width suppresser 33 makes it possible to achieve reliable data transfer when a sufficient timing relationship cannot be guaranteed by use of either one of them.

Figure 11:
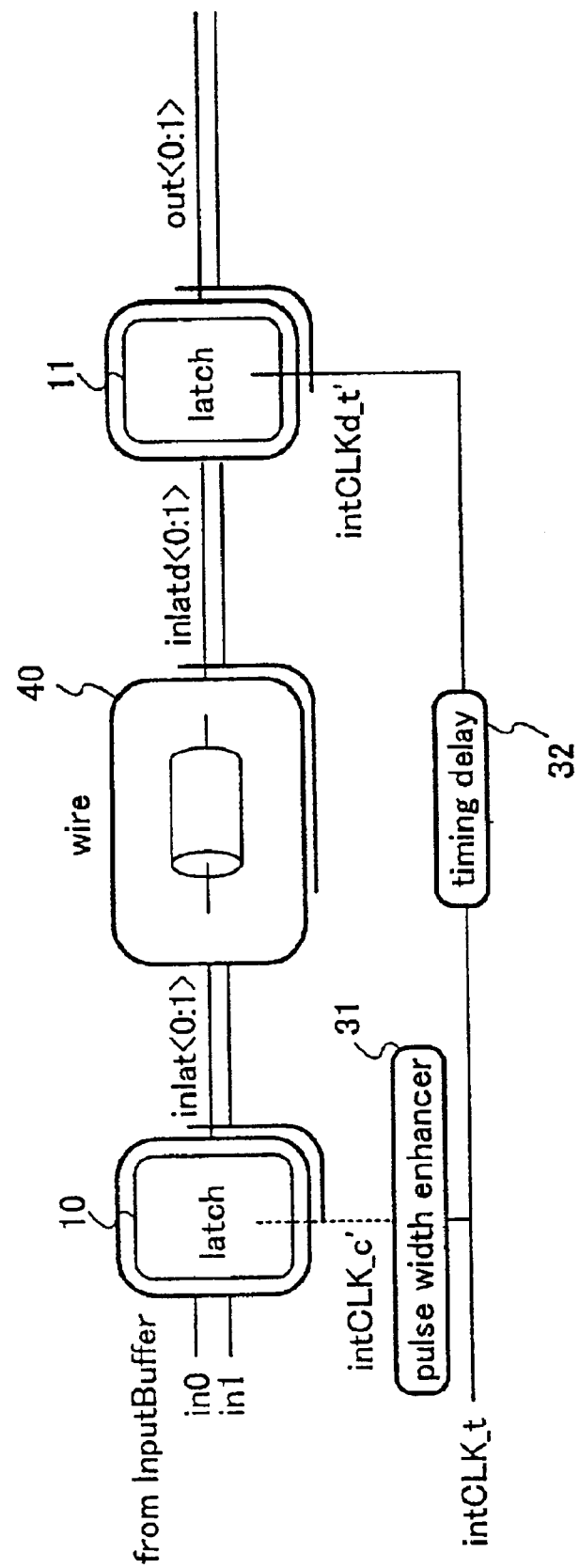
FIG. 11 is a block diagram showing a fourth embodiment of the latch circuit according to the present invention.

FIG. 11 is a block diagram showing a fourth embodiment of the latch circuit according to the present invention. An edge-trigger circuit is comprised of two latches, i.e., a latch of the first stage that holds a signal during the HIGH period of a clock signal while the signal is transferred during the LOW period of the clock signal, and a latch of the second stage that holds the signal during the LOW period of the clock signal while the signal is transferred during the HIGH period of the clock signal. In the fourth embodiment, these two latched are separated, and a long-distance wire 40 is provided therebetween. In FIG. 11, the same elements as those of FIG. 5 are referred to by the same numerals.

The configuration of FIG. 11 includes the latch 10, the latch 11, the long-distance wire 40, and the pulse width enhancer 31. The long-distance wire 40 is situated between the latch 10 and the latch 11. It should be noted that incoming signals in0 and in1 may be command signals, address signals, or the like that are supplied to a semiconductor device such as a semiconductor memory device or the like.

Figure 12:
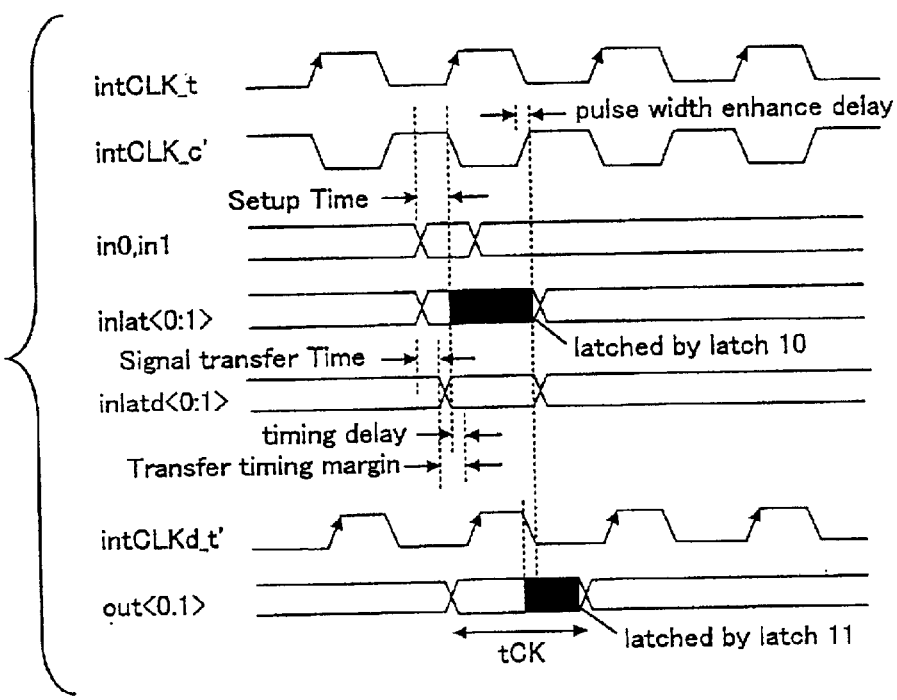
FIG. 12 is a timing chart showing an operation of the configuration of FIG. 11.

FIG. 12 is a timing chart showing an operation of the configuration of FIG. 11.

As shown in FIG. 12, when the incoming signals in0 and in1 are input by securing the setup time relative to a falling edge of the complementary clock signal intCLK_c', these incoming signals will pass through the latch 10 to be supplied to the long-distance wire 40. The long-distance wire 40 transfers the signals by utilizing the setup time. At the timing of a rising edge of the clock signal intCLK_t, the latch 10 latches the incoming signals in0 and in1. The signals inlat<0:1> latched by the latch 10 pass through the long-distance wire 40 and the latch 11, thereby being supplied to the following stage as output signals out<0:1>. At the timing of a falling edge of the delay clock signal intCLKd_t', the delayed latch signals inlatd<0:1> transferred through the long-distance wire 40 are latched by the latch 11. The signals that are latched by the latch 11 are supplied to the following stage as the output signals out<0:1>, and will be held while the delay clock signal intCLKd_t' is LOW. In this manner, the output signals out<0:1> are output during a period of 1tCK (tCK: one clock cycle).

In the configuration of FIG. 11, like the configuration of FIG. 5, the pulse width enhancer 31 extends the latch signal hold time of the latch 10, thereby achieving proper signal transfer as shown in FIG. 12.

In the present invention as described above, the long-distance wire is situated between the two latches together forming an edge-trigger circuit, and transfers signals by utilizing the setup time, thereby hiding a time delay caused by the signal transfer. Since the pulse width enhancer extends the pulse width and does nothing more, the latch timing of the first-stage latch is basically an edge timing for which no timing adjustment is made, thereby generating little timing deviation. It should be noted that the timing width enhancer does not have to be provided if the timing margin is sufficient.

The fourth embodiment directed to the long-distance wire configuration may be modified such as to be provided with a pulse width suppresser instead of the pulse width enhancer, or may be modified such as to be provided with both the pulse width enhancer and the pulse width enhancer, as in the second and third embodiments directed to the decoder configuration.

Figure 13:
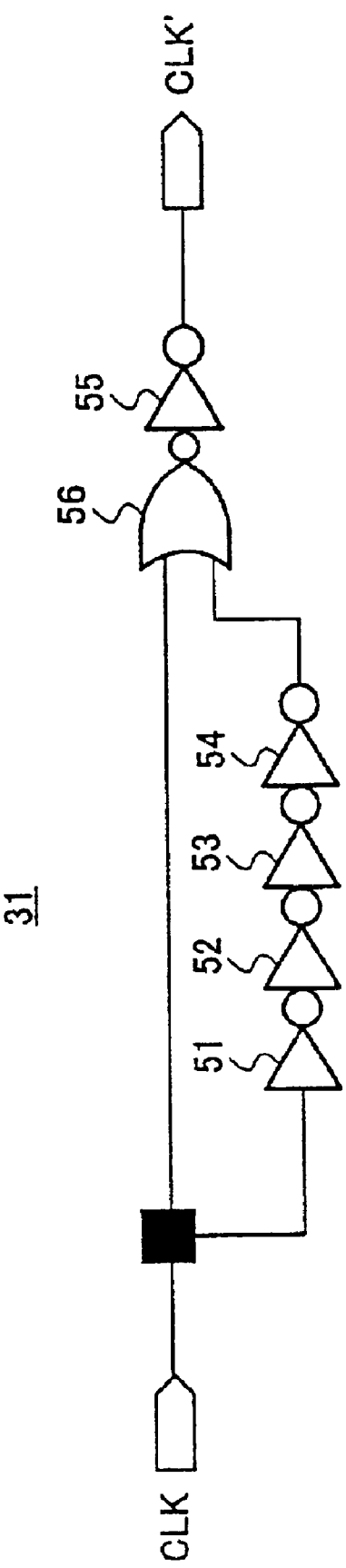
FIG. 13 is a drawing showing a circuit configuration of a pulse width enhancer.

FIG. 13 is a drawing showing a circuit configuration of the pulse width enhancer 31.

The pulse width enhancer 31 of FIG. 13 includes inverters 51 through 55 and a NOR circuit 56. When the input-clock signal CLK is set to HIGH, the output of the inverter 55 will be set to HIGH in response. Thereafter, the HIGH level of the input-clock signal CLK incurs a predetermined delay through a series of the inverters 51 through 54, followed by being input into the NOR circuit 56. When this happens, however, the output of the inverter 55 remains HIGH. Since the output of the series of the inverters 51 through 54 remains HIGH for the predetermined delay time after the input-clock signal CLK is set to LOW, the output of the inverter 55 stays at HIGH after the change to LOW of the input-clock signal CLK. Thereafter, the LOW level of the input-clock signal CLK incurs the predetermined delay through the series of the inverters 51 through 54, and is input into the NOR circuit 56, prompting the output of the inverter 55 to change to LOW. In this manner, the pulse width is extended by the predetermined delay.

Figure 14:
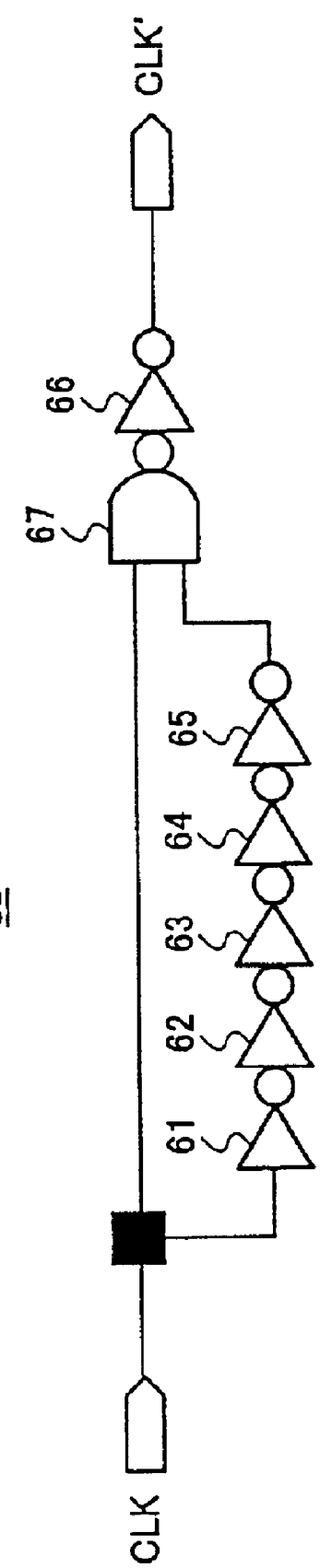
FIG. 14 is a drawing showing an example of a circuit configuration of a pulse width suppresser.

FIG. 14 is a drawing showing an example of a circuit configuration of the pulse width suppresser 33.

The pulse width suppresser 33 of FIG. 14 includes inverters 61 through 66 and a NAND circuit 67. When the input-clock signal CLK is set to HIGH, the output of the inverter 66 will be set to HIGH in response. The HIGH level of the input-clock signal CLK incurs a predetermined delay through a series of the inverters 61 through 65, followed by being input to the NAND circuit. In response, the output of the inverter 66 changes to LOW. In this manner, the pulse width is shortened to the length of the predetermined delay.

Figure 15:
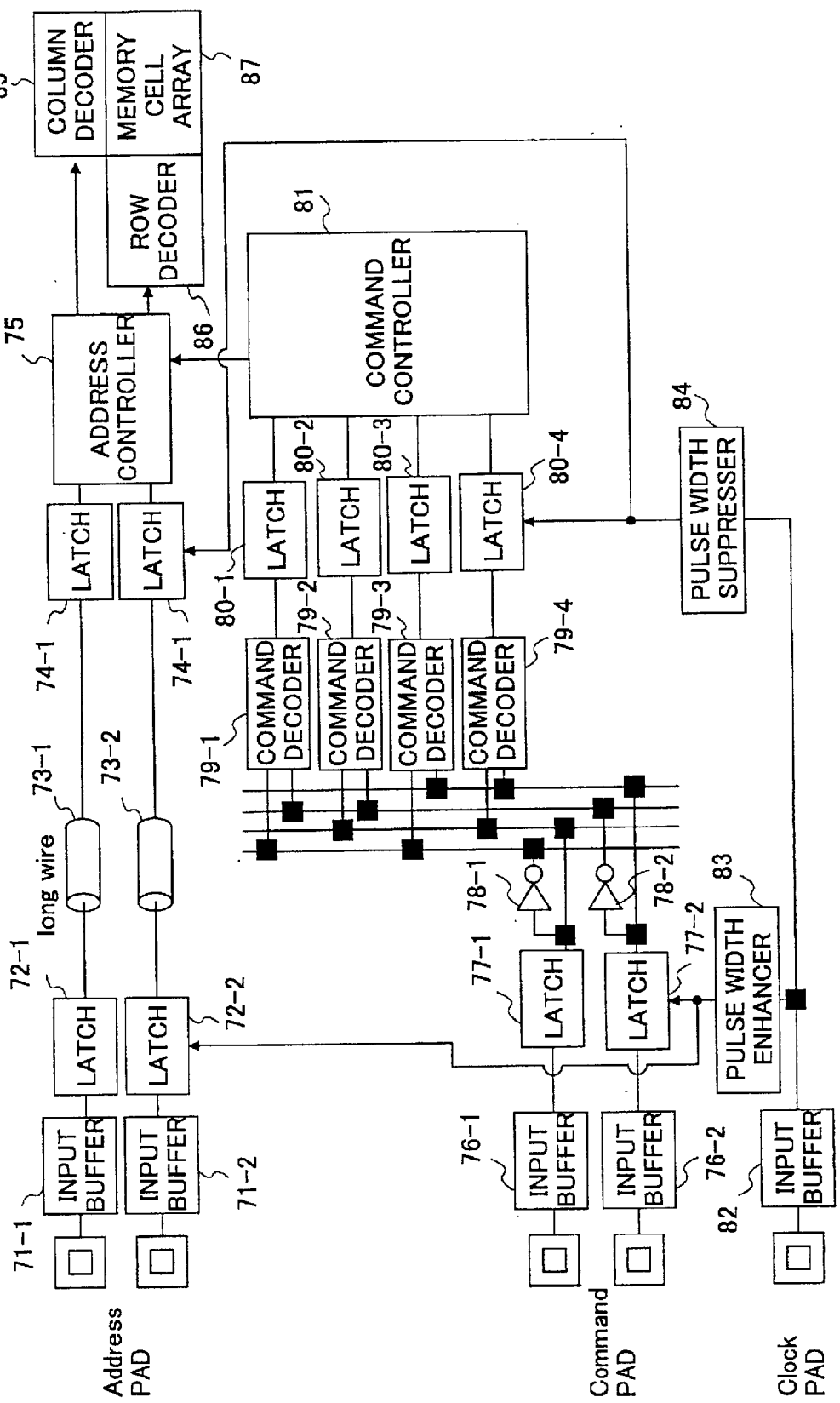
FIG. 15 is a block diagram showing a configuration of a semiconductor memory device to which the latches of the present invention are applied.

FIG. 15 is a block diagram showing a configuration of a semiconductor memory device to which the latches of the present invention are applied.

The semiconductor memory device of FIG. 15 includes input buffers 71-1 and 71-2, latches 72-1 and 72-2, long-distance wires 73-1 and 73-2, latches 74-1 and 74-2, an address controller 75, input buffers 76-1 and 76-2, latches 77-1 and 77-2, inverters 78-1 and 78-2, command decoders 79-1 through 79-4, latches 80-1 through 80-4, a command controller 81, an input buffer 82, a pulse width enhancer 83, a pulse width suppresser 84, a column decoder 85, a row decoder 86, and a memory cell array 87.

When address signals (e.g., 2 bits in FIG. 15) are supplied to the input buffers 71-1 and 71-2, the address controller 75 receives the address signals through the first-stage latches 72-1 and 72-2, the long-distance wires 73-1 and 73-2, and the second-stage latches 74-1 and 74-2. The address controller 75 supplies a column address to the column decoder 85, and supplies a row address to the row decoder 86. The column decoder 85 and the row decoder 86 decode the respective addresses, thereby allowing access to be made to the specified address of the memory cell array 87.

When command signals (e.g., 2 bits in FIG. 15) are input into the input buffers 76-1 and 76-2, the command controller 81 receives these command signals through the first-stage latches 77-1 and 77-2, the inverters 78-1 and 78-2, the command decoders 79-1 through 79-4, and the second-stage latches 80-1 through 80-4. The command controller 81 attends to access control by controlling the address controller 75 and the like according to the command decoding results produced by the command decoders 79-1 through 79-4.

A clock signal is supplied to the input buffer 82, and is then supplied from the input buffer 82 to the pulse width enhancer 83 and the pulse width suppresser 84. The pulse width enhancer 83 extends the pulse width of the clock signal, and supplies the extended pulse signal to the address-system first-stage latches 72-1 and 72-2 and to the command-system first stage latches 77-1 and 77-2. The pulse width suppresser 84 shortens the pulse width of the clock signal, and supplies the shortened pulse signal to the address-system second-stage latches 74-1 and 74-2 and to the command-system second-stage latches 80-1 through 80-4.

In the address system, the first-stage latches and the second-stage latches are separated from each other and provided at the respective ends of the long-distance wires used for the transfer of address signals, thereby making it possible to hide the time required for signal transfer on the long-distance wires. This achieves high-speed operations of the latching and the address-signal transfer. In the command system, the command decoders are situated between the first-stage latches and the second-stage latches, thereby making it possible to hide the time required by the command decoders for decoding commands. This achieves high-speed operations of the latching and the command decoding.

Figure 16:
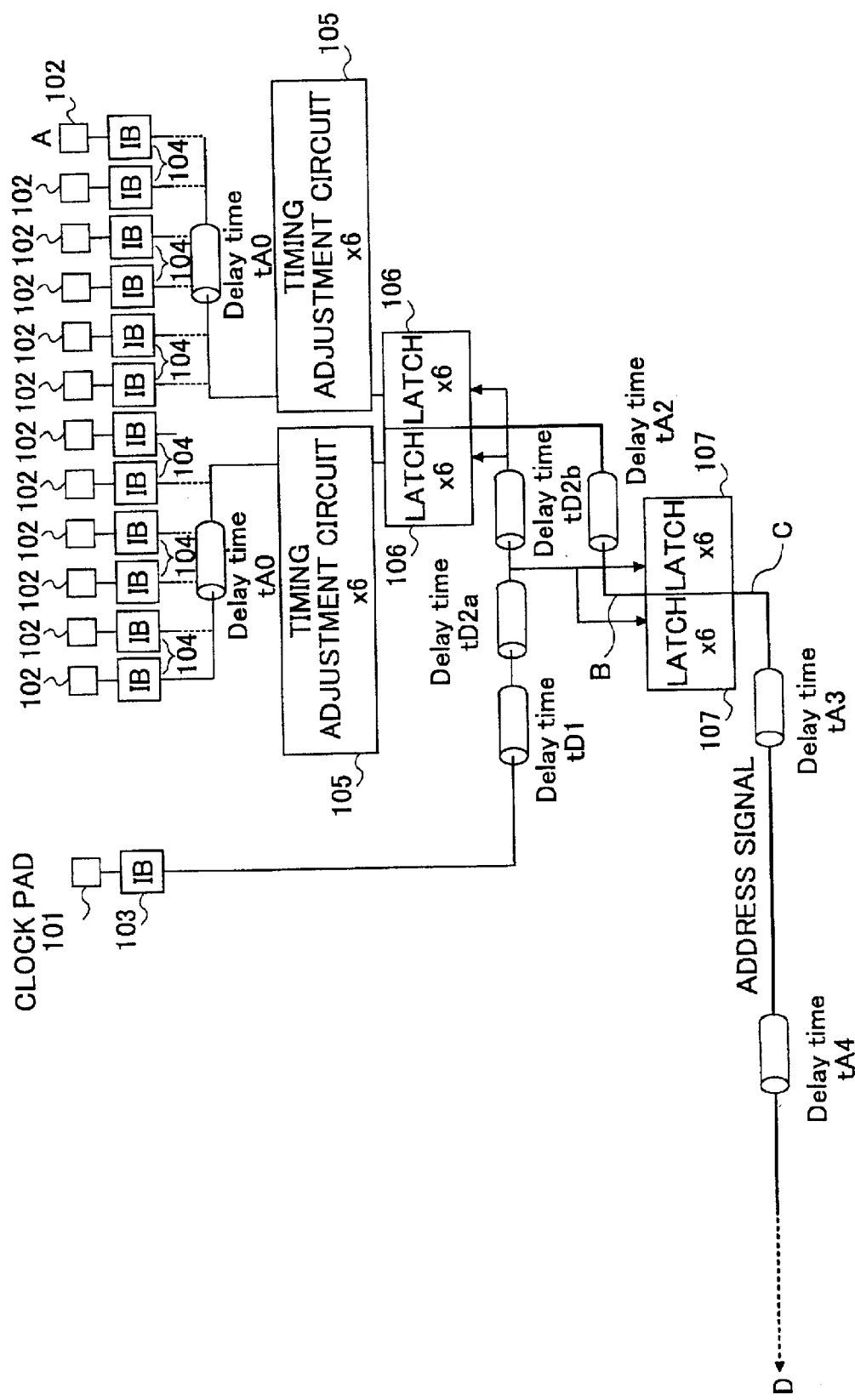
FIG. 16 is a drawing showing the details of a configuration in which the latch circuits of the present invention are applied to long-distance wires for address signals in a semiconductor memory device.

FIG. 16 is a drawing showing the details of a configuration in which the latch circuits of the present invention are applied to long-distance wires for address signals in a semiconductor memory device.

The configuration of FIG. 16 includes a clock pad 101, a plurality of address pads 102, a clock input buffer (IB) 103, a plurality of address clock buffers (IB) 104, a plurality of timing adjustment circuits 105 corresponding to the respective address signals, first-stage latches 106 corresponding to the respective address signals, and second-stage latches 107 corresponding to the respective address signals.

In the pad arrangement of ordinary chips, the clock pad 101 is positioned at the chip center, and the plurality of address pads 102 are arranged in one line extending from the chip center to a chip edge on one side of the chip. In the configuration of FIG. 16, the first-stage latches 106 are provided approximately at the center of the line of the address pads 102 in order to reduce the delay of the clock signal incurred through signal wires. A delay of the clock signal from the clock input buffer 103 to the first-stage latches 106 is tD1+tD2a+tD2b. Here, tD1 is a wire delay from the clock pad 101 to the leftmost address pad 102, and tD2a+tD2b is a wire delay from the leftmost address pad 102 to the center address pad 102. The clock signal wire branches halfway between the leftmost address pad 102 and the center address pad 102 so as to supply the clock signal to the second-stage latches 107. A delay of the clock signal supplied to the second-stage latches 107 is tD1+tD2a.

Delays of the address signals arriving at the timing adjustment circuits 105 are the longest with respect to the leftmost address pad 102 and the rightmost address pad 102 that is indicated as A. The length of this longest delay is tA0. The delay time tA0 is substantially the same as the delay tD2a+tD2b of the clock signal. The timing adjustment circuits 105 serve to adjust the timing of address signals propagating through different wire lengths from the address pads 102 to the timing adjustment circuits 105, and create delays ranging from 0 to tA0 according to the wire lengths. A delay 0 is given to the address signal corresponding to the leftmost address pad 102 and the address signal corresponding to the rightmost address pad 102 indicated as A, and the delay tA0 is given to the center address pad 102. With this provision, all the address signals end up having substantially the same delay tA0.

Since the first-stage latches 106 latch the address signals in response to the clock signal having the delay tD1+tD2 (tD2=tD2a+tD2b), the delay tA0 of the address signals are absorbed by the delay of the clock signal at the moment the first-stage latches 106 latch the address signals.

Figure 17:
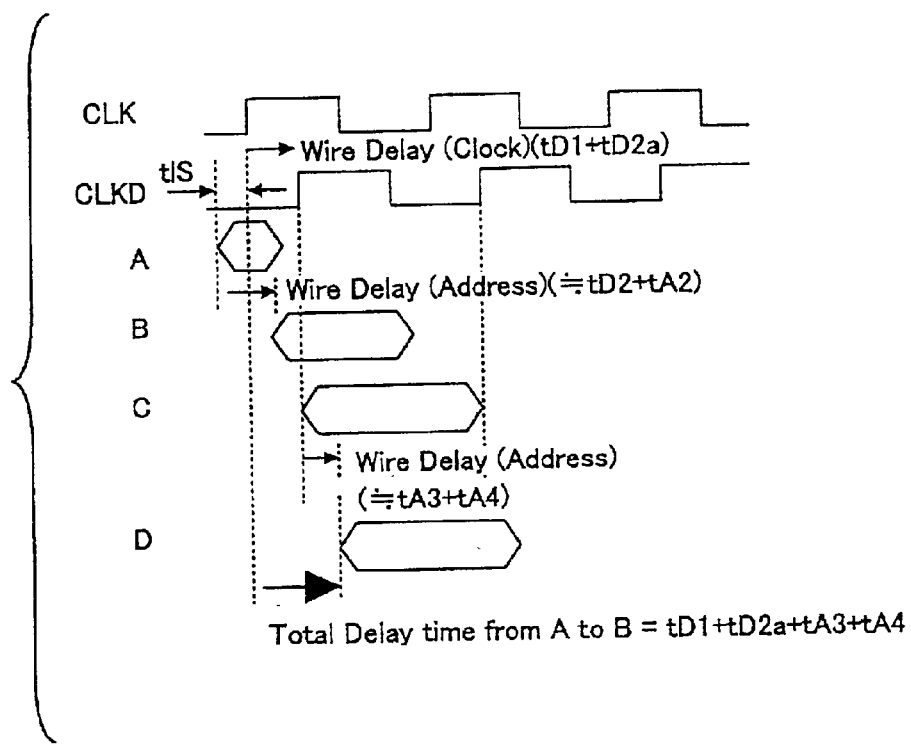
FIG. 17 is a drawing showing the operation timing of the configuration of FIG. 16.

FIG. 17 is a drawing showing the operation timing of the configuration of FIG. 16.

As shown in FIG. 17, the address signal input to the point A in FIG. 16 is supplied with the margin corresponding to the setup time tIS relative to a rising edge of the clock signal CLK. This address signal incurs a delay of tA0+tA2 (≈tD2+tA2) through the wire before it reaches the point B in FIG. 16 (indicated by a letter designation B in FIG. 17). The first-stage latch 106 that is situated at an intervening position latches the address signal at a rising edge of the clock signal delayed by tD1+tD2, and the address signal is maintained at the point B slightly longer than half the cycle of the clock signal.

The address signal at the point B passes through one of the second-stage latches 107 to reach a point C in FIG. 16 at the timing of a rising edge of a clock signal CLKD that is delayed by tD1+tD2a relative to the input-clock signal CLK. As indicated by a letter designation C in FIG. 17, thereafter, the address signal is latched by one of the second-stage latches 107 at the timing of a falling edge of the clock signal CLKD. The signal at the point C output from the latch 107 incurs a wire delay of tA3+tA4, following by reaching a point D in FIG. 16 (indicated by a letter designation D in FIG. 17). As a result, the total of signal delays from the point A to the point D is tD1+tD2a+tA3+tA4.

In this manner, the configuration of FIG. 16 absorbs the wire delays between the first-stage latches and the second-stage latches, thereby achieving high-speed signal transfer.

Further, the present invention is not limited to these embodiments, but various variations and modifications may be made without departing from the scope of the present invention.

The present application is based on Japanese priority application No. 2001-307901 filed on Oct. 3, 2001, with the Japanese Patent Office, the entire contents of which are hereby incorporated by reference.

What is claimed is:

1. A semiconductor device, comprising:
   a first latch which receives an input signal, and holds the input signal during a half cycle period of a first clock signal;
   a delay element or a decoder circuit coupled to an output of said first latch;
   a second latch which is coupled to an output of said delay element or said decoder circuit, and holds a signal output from said delay element or said decoder circuit during a half cycle period of a second clock signal; and
   a circuit which adjusts at least one of the first clock signal and the second clock signal such that the signal latched by said first latch during the half cycle period of the first clock signal is latched via said delay element or said decoder circuit by said second latch during the half cycle period of the second clock signal that follows the half cycle period of the first clock signal.

2. The semiconductor device as claimed in claim 1, wherein said delay element is a long-distance wire.

3. The semiconductor device as claimed in claim 1, wherein said circuit extends the half cycle period of the first clock signal.

4. The semiconductor device as claimed in claim 1, wherein said circuit shortens the half cycle period of the second clock signal.

5. The semiconductor device as claimed in claim 1, wherein said circuit extends the half cycle period of the first clock signal, and shortens the half cycle period of the second clock signal.

6. A semiconductor device, comprising:

a first latch which receives an input signal, and holds the input signal during a half cycle period of a first clock signal;

a long-distance wire having one end thereof coupled to an output of said first latch; and a second latch which is coupled to another end of said long-distance wire, and holds the input signal supplied from said long-distance wire during a half cycle period of a second clock signal.

7. A semiconductor device, comprising:

a first latch which receives a command signal, and holds the command signal during a half cycle period of a first clock signal;

a command decoder coupled to an output of said first latch;

a second latch which is coupled to an output of said command decoder, and holds a decode signal output from said command decoder during a half cycle period of a second clock signal; and a controller which attends to access control based on the decode signal supplied from said second latch.

8. A semiconductor memory device, comprising:

a first latch which receives an address signal, and holds the address signal during a half cycle period of a first clock signal;

a long-distance wire having one end thereof coupled to an output of said first latch;

a second latch which is coupled to another end of said long-distance wire, and holds the address signal supplied from said long-distance wire during a half cycle period of a second clock signal; and an address decoder which decodes the address signal supplied from said second latch.

9. A semiconductor memory device, comprising:

a first latch which receives an address signal, and holds the address signal during a half cycle period of a first clock signal;

a long-distance wire having one end thereof coupled to an output of said first latch;

a second latch which is coupled to another end of said long-distance wire, and holds the address signal supplied from said long-distance wire during a half cycle period of a second clock signal;

an address decoder which decodes the address signal supplied from said second latch;

a third latch which receives a command signal, and holds the command signal during a half cycle period of the first clock signal;

a command decoder coupled to an output of said third latch;

a fourth latch which is coupled to an output of said command decoder, and holds a decode signal output from said command decoder during a half cycle period of the second clock signal; and a controller which attends to access control based on the decode signal supplied from said fourth latch.

* * * * *